United States Patent
Irvine et al.

(10) Patent No.: US 11,249,158 B2
(45) Date of Patent: Feb. 15, 2022

(54) METHOD AND PROCEDURE FOR SIGNAL ESTIMATION AND DATA HARMONIZATION FOR MAGNETIC RESONANCE SPECTROSCOPY (MRS)

(71) Applicants: The Charles Stark Draper Laboratory, Inc., Cambridge, MA (US); The Brigham and Women's Hospital, Inc., Boston, MA (US)

(72) Inventors: John M. Irvine, Somerville, MA (US); Laura J. Mariano, Somerville, MA (US); Alexander P. Lin, Boston, MA (US)

(73) Assignees: The Charles Stark Draper Laboratory, Inc., Cambridge, MA (US); The Brigham and Women's Hospital, Inc., Boston, MA (US)

( * ) Notice: Subject to any disclaimer, the term of this patent is extended or adjusted under 35 U.S.C. 154(b) by 108 days.

(21) Appl. No.: 16/324,193

(22) PCT Filed: Aug. 10, 2017

(86) PCT No.: PCT/US2017/046219
§ 371 (c)(1),
(2) Date: Feb. 8, 2019

(87) PCT Pub. No.: WO2018/031723
PCT Pub. Date: Feb. 15, 2018

(65) Prior Publication Data
US 2020/0191891 A1    Jun. 18, 2020

Related U.S. Application Data

(60) Provisional application No. 62/372,834, filed on Aug. 10, 2016.

(51) Int. Cl.
*G01R 33/46* (2006.01)

(52) U.S. Cl.
CPC ............... *G01R 33/4625* (2013.01)

(58) Field of Classification Search
CPC ............ G01R 33/4625; G01R 33/5608; G01R 33/281; G01R 33/4806; G01R 33/4828;
(Continued)

(56) References Cited

U.S. PATENT DOCUMENTS

2002/0145424 A1* 10/2002 Uetake ............. G01R 33/56563
324/307
2013/0131992 A1* 5/2013 Wilkes ................... G16H 50/20
702/19
(Continued)

OTHER PUBLICATIONS

Sun et al. "Histogram-based normalization technique on human brain magnetic resonance images from different acquisitions," BioMed Eng Online, 14:73; 215 (Year: 2015).*
(Continued)

*Primary Examiner* — Lee E Rodak
(74) *Attorney, Agent, or Firm* — HoustonHogle LLP

(57) ABSTRACT

A method and a system for analysis of raw MRS data, in the form of signal strength versus chemical shift (ppm), from multiple scanners, includes "signal estimation" from each raw data set, followed by cross-scanner "data harmonization" of results. The final resulting MRS signals are consistent from one scanner to another, and are used for analysis by radiologists and other physicians.

15 Claims, 7 Drawing Sheets

(58) Field of Classification Search
CPC .............. G01R 33/56; G01R 33/5601; G01R 33/5602; G01R 33/56341; G01R 33/56563; G01R 33/5659; G01R 33/243; G01R 33/3415; G01R 33/481; G01R 33/4812; G01R 33/4816; G01R 33/485; G01R 33/5607; G01R 33/5611; G01R 33/5616; G01R 33/56509; G01R 33/56518; G01R 33/56554; G01R 33/58; G01R 33/583; A61B 5/055; A61B 2576/026; A61B 5/0042; A61B 5/4842; A61B 5/4848; A61B 5/7275; A61B 5/0037; A61B 5/4088; A61B 5/7264; A61B 6/501

See application file for complete search history.

(56) References Cited

U.S. PATENT DOCUMENTS

| | | | |
|---|---|---|---|
| 2016/0171670 A1* | 6/2016 | Koehler | G01R 33/5608 382/131 |
| 2016/0216352 A1* | 7/2016 | Eggers | G01R 33/5608 |

OTHER PUBLICATIONS

Fortin et al. "Removing inter-subject technical variability in magnetic resonance imaging studies," NeuroImage 132, 198-212, 2016 (Year: 2016).*

Chard et al. "Reproducibility of In Vivo Metabolite Quantification With Proton Magnetic Resonance Spectroscopic Imaging," Journal of Magnetic Resonance Imaging, 15:219-225, 2003 (Year: 2003).*

Van de Blank et al., "Multi-center reproducibility of neurochemical profiles in the human brain at 7 Tesla," NMR Biomed. 28:306-315, 2015 (van de Blank). (Year: 2015).*

International Preliminary Report on Patentability, dated Feb. 21, 2019, from International Application No. PCT/US2017/046219, filed on Aug. 10, 2017. 13 pages.

Bluml, S., et al., "Magnetic Resonance Spectroscopy: Basics," MR Spectroscopy of Pediatric Brain Disorders, Springer-Verlag, 11-23 (2013).

Irvine, J. M., et al., "Robust Functional Data Analysis Approach to Data Harmoization and Signal Estimation," International Society for Magnetic Resonance in Medicine: Workshop on MR Spectroscopy: From Current Best Practice to Latest Frontier, (2016).

Ramsay, J.O. & B.W.Silverman, Functional Data Analysis, 2nd Ed., New York: Springer (2005).

Chard, D.T., et al., "Reproducibility of In Vivo Metabolite Quantification with Proton Magnetic Resonance Spectroscopic Imaging," Journa of Magnetic Resonance Imaging, 15: 219-225 (2002).

Gubian, M., et al., "Using Functional Data Analysis for investigating multidimensional dynamic phonetic contrasts," Journal of Phonetics, 49: 16-40 (2015).

Hall, P., et al., "Two-sample Tests in Functional Data Analysis Starting from Discrete Data," Statistica Sinica, 17: 1511-1531 (2007).

"INSPECTOR: Magnetic Resonance Spectroscopy Software for Optimized Data Extraction," http://techventures.columbia.edu (2017).

International Search Report and Written Opinion, dated Mar. 29, 2018, from International Application No. PCT/US2017/046219, filed on Aug. 8, 2017. 20 pages.

James, G.M., et al., "Performing Hypothesis Tests on the Shape of Functional Data," Computational Statistics and Data Analysis, 50(1): 1-18 (2005).

Levitin, D.J. et al., "Introduction to Functional Data Analysis," Canadian Psychological Association, 48(3): 135-155 (2007).

Lin, P.D., et al., "Cleaning Data the Chauvenet Way," SESUG, Proc. South East SAS Users Gr., Hilton Head, 2007.

Mirzaalian, H., et al.,"Harmonizing Diffusion MRI Data Across Multiple Sites and Scanners," Med Image Comput Comput Assist Interv., 9349: 12-19 (2015).

Mocioiu, V., et al., "From Raw Data to Data-Analysis for Magnetic Resonance Spectroscopy—The Missing Link: jMRUI2XML," BMC, Bioinformatics, 16: 378, 2015.

Provencher, S., "LCModel & LCMgui User's Manual," 1-184 (2016).

Provencher, S.W. "Estimation of metabolite concentrations from localized in vivo proton NMR spectra," Magn. Reson. Med., 30(6):672-679 (1993).

Siddique, J., et al., "Multiple imputation for harmonizing longitudinal non-commensurate measures in individual participant data meta-analysis," Statistics in Medicine, Published online in Wiley Online Library (2014).

Van de Bank, B.L., et al., "Multi-Center Reproducibility of Neurochemical Profiles in the Human Brain at 7T," NMR Biodmed. 28: 306-316 (2015).

Wang, J.L., et al., "Review of functional data analysis," Annu. Rev. Statist., 1-41 (2015).

Zandt, HJA in 't, et al., "Common Processing of in vivo MR Spectra," NMR Biomed, 14: 224-232 (2001).

* cited by examiner

METHOD AND PROCEDURE FOR SIGNAL ESTIMATION AND DATA HARMONIZATION FOR MAGNETIC RESONANCE SPECTROSCOPY (MRS)

RELATED APPLICATIONS

This application is a § 371 National Phase Application of International Application No. PCT/US2017/046219, filed on Aug. 10, 2017, now International Publication No. WO 2018/031723, published on Feb. 15, 2018, which International Application which claims the benefit under 35 U.S.C. § 119(e) of U.S. Provisional Application No. 62/372,834, filed on Aug. 10, 2016, both of which are incorporated herein by reference in their entirety.

GOVERNMENT SUPPORT

This invention was made with Government support under contract number W81XWH-10-1-0785, awarded by the U.S. Army. The Government has certain rights in the invention.

BACKGROUND OF THE INVENTION

Both MRS (magnetic resonance spectroscopy) and MRI (magnetic resonance imaging) are based on NMR (nuclear magnetic resonance) technology which is widely used to identify relative abundance of atoms, with unpaired nuclear spin, in molecules. The nuclei of these atomic isotopes, such as H-atoms (most abundant isotope of hydrogen), carbon-13, oxygen-17, sodium-23, and phosphorus-31, are aligned in their lowest stable quantum states in the presence of a magnet. However, if exposed to radio frequency (RF) waves of the electromagnetic spectrum (e.g., around 500 mega-Hertz (MHz)), these nuclei can absorb energy from RF waves and hop to the next higher energy quantum state. NMR spectroscopy is a record of relative numbers of nuclei, which hop to the higher quantum state, versus frequency. The frequency will vary depending on the atom and the functional group (neighboring atoms) of the molecule to which the atom is attached.

NMR is ideal for imaging living tissue. Tissue contains an abundance of H-atoms, in the form of $H_2O$ and other organic molecules, and smaller but still significant amounts of sodium-23, phosphorous-31, etc. NMR is safer than X-ray based imaging (such as computerized axial tomography (CAT) scans) as the radio frequencies are much less energetic than X-rays. NMR-based MRI yields high resolution 2-D image slices from various portions of human body, which are now routinely used to identify injured tissue and tumors. In-vivo MRS is a specialized version of MRI, which, instead of 2-D image slices, is represented as a spectral curve of signal strength versus chemical shift in parts per million (ppm), defined as RF value divided by a carrier frequency in MHz. MRS is used, for example, to gauge metabolic changes in brain tumors, in areas of the brain affected by stroke and seizure, etc., by using isotope and functional group abundances of metabolites.

A review chapter of a book Blüml (Magnetic Resonance Spectroscopy: Basics in MR Spectroscopy of Pediatric Brain Disorders, Springer-Verlag, 2013) points out that MRS scans can cover 1000 times larger volumes (1-10 $cm^3$) than MRI scans (1-10 $mm^3$). Because of the larger volume, MRS data includes H-atom (proton) peaks not just from water but also from other molecules and functional groups, unlike MRI which just includes water. According to Blüml, modern MRS scanners have built-in software to analyze raw MRS data by using approved scripts which apply line broadening, Fourier transform and phasing, and the final result is delivered to the physician/radiologist.

Although analysis of MRS signal provides valuable information for medical diagnosis and addressing basic research questions, two of the many challenges of working with MRS data are the level of noise and artifacts than can arise in the raw signals and the disparity across data sets acquired from different scanners.

Software packages and published algorithms are available to analyze raw MRS data. Raw data may have variable resolutions, i.e. points/ppm, variability in manufacturer formats and slightly different acquisition conditions. Some software packages can also combine different scans. Some of these software packages and algorithms are: recent INSPECTOR package associated with MATLAB (Columbia Technology Ventures, # cu17130, 2017, by Juchem); jMRUI2XML java package (Mocioiu et al., BMC Bioinformatics, 16:378, 2015) and LC model (Provencher, "LCModel & LCMgui User's Manual"; Provencher, "Estimation of metabolite concentrations from localized in vivo proton NMR spectra", Magn Reson Med., 30(6):672-9, 1993); and, finally, Mirzaalian, et al., "Harmonizing Diffusion MRI Data Across Multiple Sites and Scanners", Med Image Comput Comput Assist Interv. 9349: 12-19, 2015 (published on-line).

SUMMARY OF THE INVENTION

This invention concerns a method and a system for signal estimation and data harmonization for MRS (magnetic resonance spectroscopy) scans from one or more commercial scanners.

Analysis of MRS signals provides valuable information for medical diagnosis and addressing basic research questions. Two of the many challenges of working with MRS data are the level of noise and artifacts than can arise in the raw signals and the disparity across data sets acquired from different devices. To address both of these issues, robust statistical methods based on functional analysis are applied to the raw signal.

This invention describes a method and a system for analysis of raw MRS data, in the form of signal strength versus chemical shift (ppm), from multiple scanners, including "signal estimation" from each raw data set, followed by cross-scanner "data harmonization" of results. The final resulting MRS signals are consistent from one scanner to another, and are used for analysis by radiologists and other physicians.

The system and method typically include two consecutive processes: signal estimation and cross-scanner data harmonization.

In general, the signal estimation process uses raw unprocessed MRS data which include signal strength as a function of chemical shift in ppm. The raw data is specific to a control subject of a scanner. Each raw dataset is processed to eliminate outlier spectra. The remaining spectra are used generate an "ideal" MRS spectrum for the control subject.

Hereinafter, the ideal MRS spectrum just described above will often be referred to as a "scanner output" or a "MRS scan".

In the data harmonization process, the scanner outputs for a number of control subjects from one or more scanners are made compatible to the same from a single reference scanner. Data harmonization describes the process of adjusting and normalizing the data acquired from one scanner to ensure that the amplitudes and frequencies of the peaks can be compared to a reference scanner. This harmonization process facilitates comparison of relative abundances of specific metabolites as measured by multiple scanners.

The embodiments in the invention use means and variances of corresponding MRS scans from a reference scanner and a second scanner to achieve data harmonization. The MRS scans are obtained via signal estimation of raw MRS data for the same control subjects. Furthermore, multiple scanners can be pair-wise harmonized with the same reference scanner.

At the heart of harmonization is a mapping (or transformation) derived from quantitative comparison (using means and variances) of scanner outputs of a reference scanner to corresponding scans (same control subjects) from another scanner (target scanner).

The mapping will be different for each target scanner even with the same reference scanner.

In general, according to one aspect, the invention features an MRS system. It comprises multiple MRS scanners producing MRS data of subjects. An analysis system then performs signal estimation to eliminate outlier spectra and a data harmonization process in which the spectra from control subjects from different scanners are made compatible.

Preferably, the analysis system performs the harmonization process by adjusting and/or normalizing the data acquired from one scanner, by using another higher quality scanner as reference, to ensure that the amplitudes and frequencies of the peaks can be compared to the reference scanner. In the current embodiment, the control subjects are scanned by each of the scanners.

Further, the signal estimation is preferably repeated until certain threshold conditions are met. Example conditions include a minimum percentage of raw data that must be included to compute the mean and a specified signal-to-noise (SNR) ratio. SNR is the mean value of the spectrum divided by the standard deviation of the spectrum, performed pointwise on a function set and integrated over the range of 0-4 ppm.

In general, according to one aspect, the invention features a method for harmonizing MRS data. The method comprises producing raw MRS data of control subjects and performing signal estimation to eliminate outlier spectra; and data harmonization in which the spectra from the control subjects from different scanners are made compatible.

The above and other features of the invention, including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

The invention now will be described more fully hereinafter with reference to the accompanying drawings, in which illustrative embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

As used herein, the term "and/or" includes any and all combinations of one or more of the associated listed items. Further, the singular forms and the articles "a", "an" and "the" are intended to include the plural forms as well, unless expressly stated otherwise. It will be further understood that the terms: includes, comprises, including and/or comprising, when used in this specification, specify the presence of stated features, integers, steps, operations, elements, and/or components, but do not preclude the presence or addition of one or more other features, integers, steps, operations, elements, components, and/or groups thereof. Further, it will be understood that when an element, including component or subsystem, is referred to and/or shown as being connected or coupled to another element, it can be directly connected or coupled to the other element or intervening elements may be present.

Figure 1A:
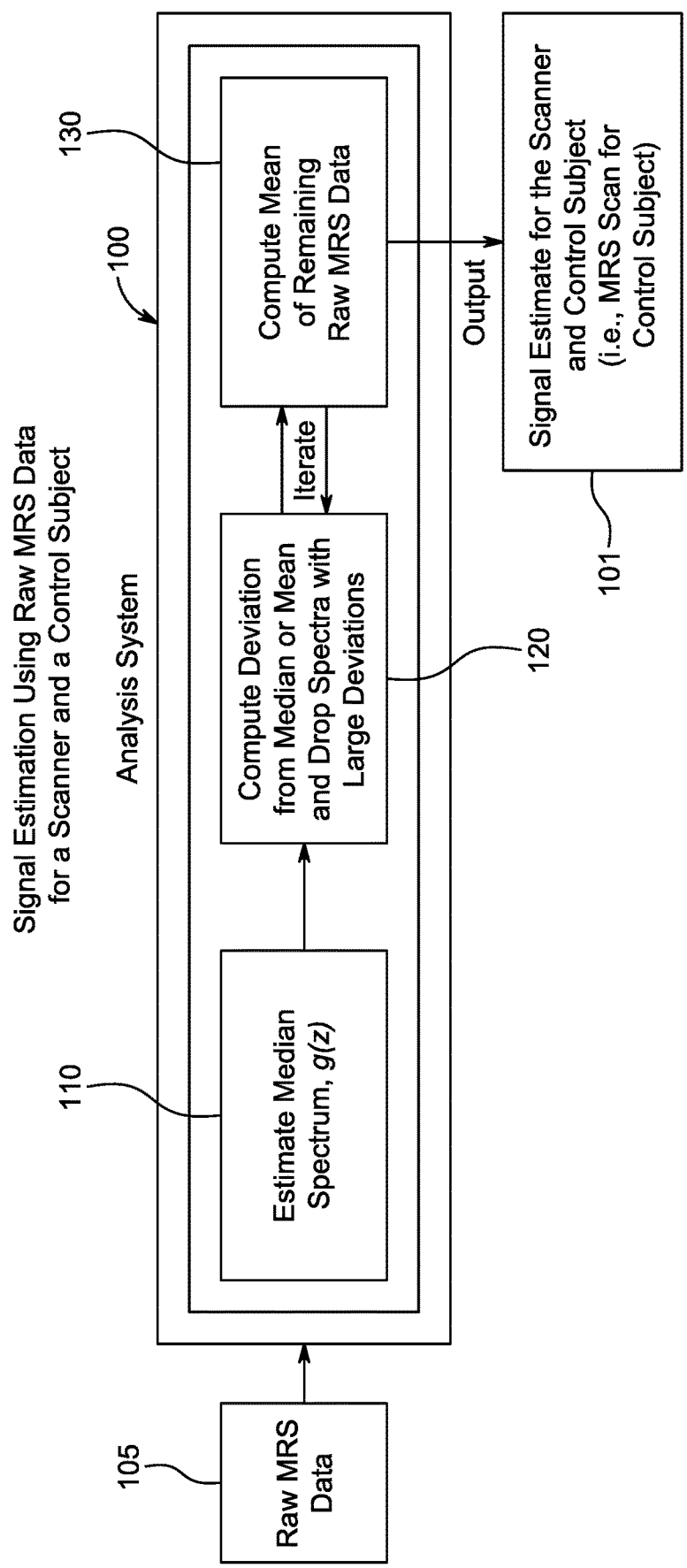
FIG. 1A is a flow diagram showing the steps and flow of data for signal estimation which estimates MRS signal from raw data for a given scanner and control subject.
Figure 1B:
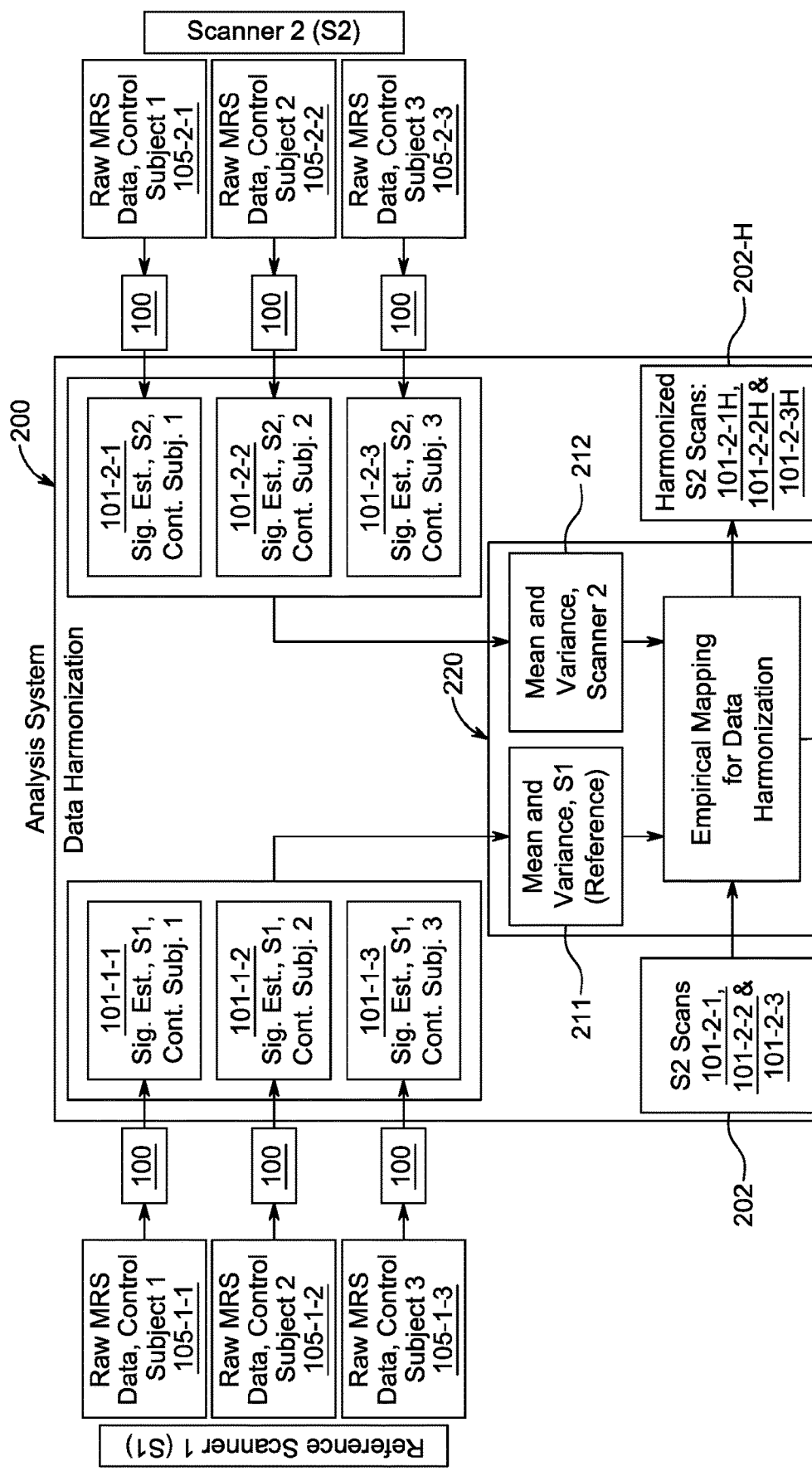
FIG. 1B is a system block diagram showing the steps and flow of data for data harmonization which harmonizes scans from scanners, such as those from a reference scanner and a target scanner.

FIGS. 1A and 1B show the steps and flow for estimating MRS signals from raw data (signal estimation), and then harmonizing MRS scans (data harmonization) from two different scanners S1, S2 according to the principles of the present invention. One of the scanners, in this case S1, is chosen as the reference scanner. The other, S2, is the target scanner.

Ideally, the reference scanner should be the one that produces higher quality scans. Without that prior knowledge, the choice of reference is arbitrary. If more than two scanner results are being harmonized, the highest quality scanner among the lot of scanners should be the reference scanner. If that information is not known, any one scanner can be the reference scanner. The spectra from all other scanners are pair-wise harmonized with respect to the reference scanner.

In general, FIG. 1A shows the signal estimation process flow 100 starting with raw MRS data 105 from a scanner. The output 101 of the signal estimation process for a given scanner and a control subject is referred to as the MRS scan. FIG. 1B shows results from harmonizing scans from two scanners S1, S2 in the data harmonization step. S1 is chosen to be the reference scanner, the scans of which will be unchanged in the harmonization process. The scans from S2 will be changed (i.e., harmonized).

In more detail, referring to FIG. 1A in step 110, one starts with raw MRS data $s_i(z)$ 105 from one control subject from a scanner and then a median spectrum $g(z)$ is selected. Here the subscript i denotes an individual spectra in the raw data collection; s and g denote signal strength; and z is in ppm. Deviations of each signal from the mean are computed and signals with large deviations are dropped in step 120. Finally in step 130 a mean (as a function of ppm, z) is calculated The median spectrum $g(z)$ could be in a tabular form of strength defined on a discrete set of z-values. The g-values for the discrete z-values could be the median or average values of $s_i$ at the corresponding z-value. Alternatively, $g(z)$ could be one of the $s_i$ curves which "snakes" through the middle of the $s_i$ collection. The formula for deviation is the $L^2$-norm from functional analysis and is given by $$D_i = \int_{z0}^{z1} [s_i(z) - g(z)]^2 dz$$

Results from step 130 can be fed back into step 120 to repeat (iterate) the cycle until specified threshold condition(s) are met. One threshold could be, for example, a minimum percentage of raw data that must be included to compute the mean. Another threshold could be a specified signal-to-noise (SNR) ratio.

Box 101 contains the final mean of raw MRS data. This is the estimated scanner signal from the signal estimated step. This signal will be referred to as the MRS scan for the control subject and the scanner under consideration.

Thus an "MRS scan" is the output 101 of the signal estimation process that starts with raw MRS data 105 as input. The data harmonization process harmonizes MRS scans from target scanner with respect to those from a reference scanner.

Referring to FIG. 1B, data harmonization process 200 will now be described. Here S1 will be the reference scanner. The reference MRS scan for a control subject (control subject 1) is shown in box 101-1-1 using the notation 101-*m-n* where m denotes the scanner, n denotes the control subject, and as shown in FIG. 1A, 101 denotes the output of the signal estimation process. 101-1-2 and 101-1-3 are S1 scans for control subjects 2 and 3, respectively. The raw MRS data from S1 are 105-1-1 (for S1, control subject 1), 105-1-2 (S1, control subject 2) and 105-1-3 (S1, control subject 3). For raw MRS data, the notation is 105-*m-n*, where 105 denotes raw data (FIG. 1A) and m and n denote scanner and control subject, respectively. Each raw MRS data set 105 undergoes the signal estimation process 100 and produces output 101, which is referred to as MRS scan.

The right side of FIG. 1B uses scans from the target sensor, S2, whose scans are 101-2-1 (S2, control subject 1, using raw MRS data 105-2-1), 101-2-2 (S2, control subject 2, using raw MRS data 105-2-2), and 101-2-3 (S2, control subject 3, using raw MRS data 105-2-3). The control subjects are the same as those for reference scanner S1. Again the notation used here are 101-*m-n* and 105-*m-n*. Here m is 2 for the sensor (S2) and n refers to the control subjects 1, 2 and 3. 101 refers to output (MRS scan) of signal estimation process 100 and 105 refers to input (raw MRS data) to signal estimation 100.

The scans from S1 (101-1-1, 101-1-2 and 101-1-3) and S2 (101-2-1, 102-2-2 and 101-2-3) are fed into the data harmonization engine 220. First mean and variances (which are first and second moments, respectively) for each scanner are computed in steps 211 (S1) and 212 (S2). For reference scanner S1, step 211 computes mean and variance using the scans from S1 for control subjects 1 (101-1-1), control subject 2 (101-1-2) and control subject 3 (101-1-3). Similarly step 212 uses target scanner S2 scans for control subjects 1 (101-2-1), 2 (101-2-2) and 3 (101-2-3) to compute mean and variance.

Data harmonization process then uses the mean and variance of S1 and S2 to produce an empirical mapping 222 for data harmonization, which will transform S2 scans 101-2-1, 101-2-1 and 101-2-3 (see box 202) into harmonized scans 101-2-1H, 101-2-2H and 101-2-3H (see box 202H) so than they can be more easily compared with reference scans from S1, 101-1-1, 101-1-2 and 101-1-3.

In more detail, once the empirical mapping 222 is developed, it is used on original sensor 2 S2 scans 101-2-1, 102-2-2 and 102-3, for control subjects 1, 2 and 3, to obtain three harmonized scans 101-2-1H, 101-2-2H and 101-2-3H for the corresponding subjects. S1 scans 101-1-1, 101-1-2 and 101-1-3, remain unchanged. The motivation behind harmonization is that the harmonized scans of S2 are easier to compare against reference S1 scans than un-harmonized scans.

Although only 3 control subjects are used for illustration, ideally the number of control subjects should be as large as possible for better statistical representation of MRS scans. Thus, n should ideally be much higher than 3, however it could be as low as 2.

Using the same reference, additional scanners can be harmonized with respect to that reference scanner in a pair-wise manner. Ideally, if more than two scanners are involved, the reference scanner should be the same for all pair-wise harmonization processes. The reference scanner should be the one which produces most ideal scans. If this information is not available, the choice of reference scanner is arbitrary.

In this invention the harmonization was carried out specifically this way. Two sets of MRS scans, one from Siemens (Siemens 3T Skyra) and another from GE (GE 3T 750w), were available for data harmonization. The process is to pick one scanner as the reference. In this case the Siemens scanner is the reference. The signals are divided by respective standard deviations to get two normalized signals. Then the ratio of the Siemens to the GE is used to adjust the GE signal, so that the two have the same global average. Then the adjusted GE signal is multiplied by the original standard deviation to get the final result. Thus the new GE signal has the same mean level as the Siemens signal, but retains its original variance.

Figure 2A:
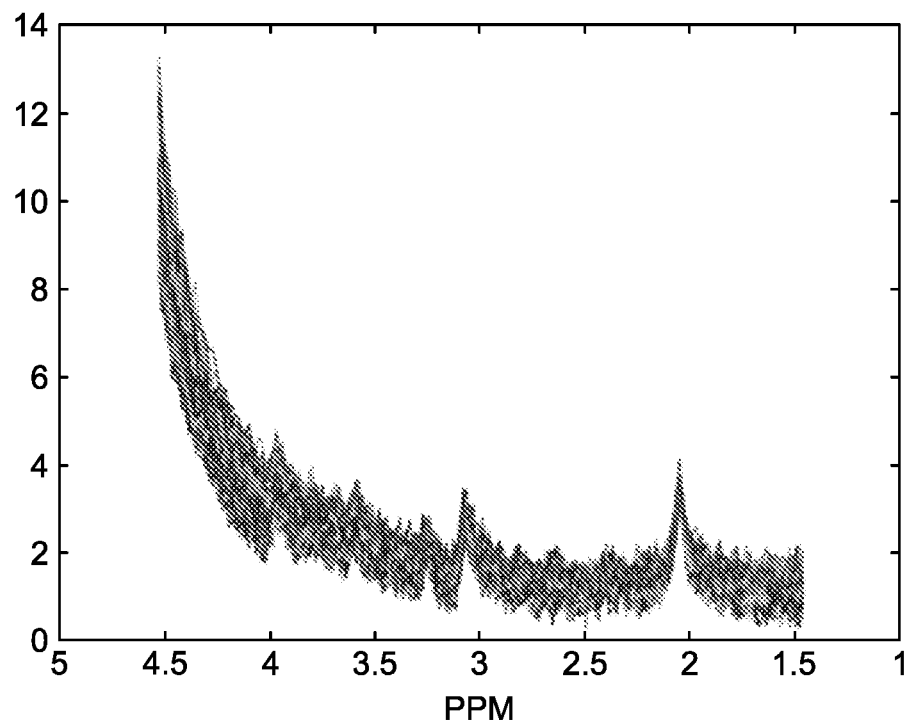
FIG. 2A shows raw MRS spectra from a noisy collection showing relative abundances of H-atoms (signal strength) as a function of chemical shift (ppm). The data is from a GE scanner (GE 3T 750w).
Figure 2B:
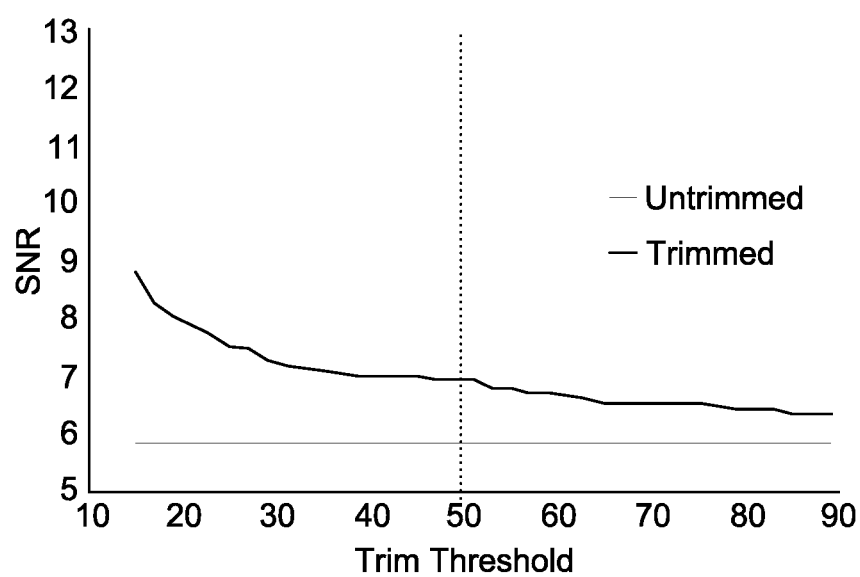
FIG. 2B shows signal to noise ratio (SNR) from 0-4 ppm for the entire collection of data in FIG. 2A, with all curves included (flat line) and for smaller sets of data where certain number of curves are dropped based on their deviation from the mean curve. The x-axis here denotes percentage of data included.

FIG. 2A shows a plot of a collection of raw MRS data for the GE scanner for a control subject. The data are in the form of signal strength versus ppm. FIG. 2B shows a plot of signal to noise ratio (SNR) from 0-4 ppm as a function of percentage of raw data included in computing the SNR ratio. For example, a 50% trim threshold refers to 50 percent of data with largest deviations being dropped from SNR computation. The flat line is the SNR value (a little under 6) when all data are used to compute SNR. SNR value is higher (about 9) when only 15% of lowest deviation curves are used to compute SNR. When more and more data are retained, SNR approaches the flat line for all data. Note that the deviations are calculated using the equation shown above.

The SNR results plotted are the result of iteration over eliminating outlier signals, re-computing the mean over the remaining signals and then computing SNR. This results in better SNR than yielded by the scanners which typically use all of the raw data without eliminating any outliers.

Figure 3A:
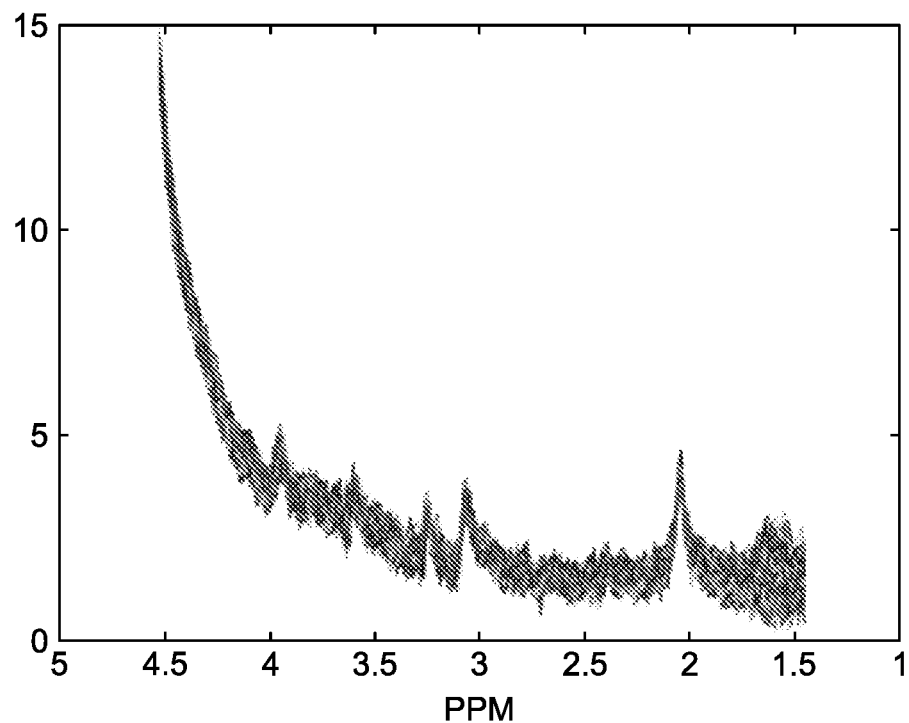
FIG. 3A shows raw MRS spectra from a higher quality collection (less noisy source) showing signal strength as a function of ppm. The data is from a Siemens scanner (Siemens 3T Skyra).
Figure 3B:
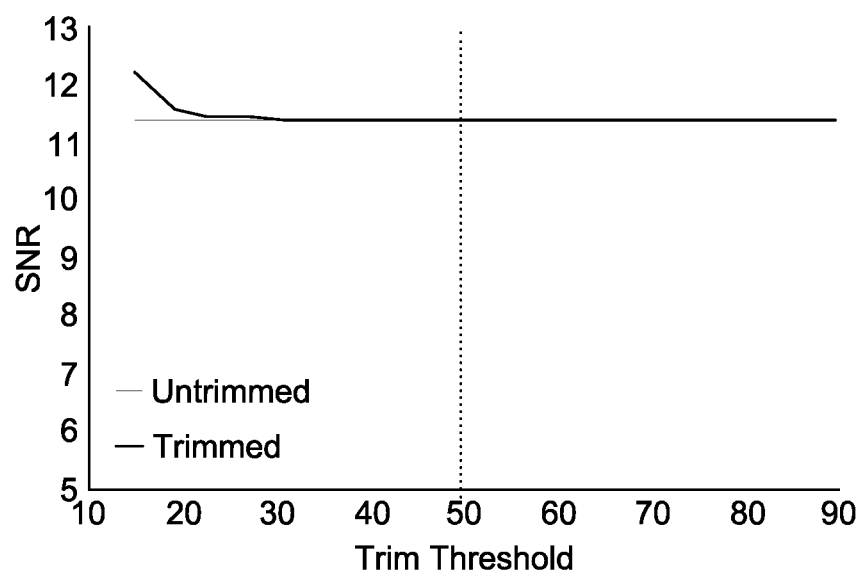
FIG. 3B shows SNR from 0-4 ppm for the entire collection of data in FIG. 3A, and for smaller sets of data where certain number of curves are dropped based on their deviation from the mean curve. The x-axis here denotes percentage of data included.

FIGS. 3A and 3B show similar plots as in FIG. 2A and FIG. 2B, but for the Siemens scanner. FIG. 3A data has less of a spread than FIG. 2A data. Therefore, SNR does not show improvement unless more and more data are rejected. FIG. 3B shows that unless more than 80% of data are rejected (i.e., only 20% or less are retained for SNR computation), SNR does not improve from the flat line value of about 11.4 for all data.

Analysis suggests this method can substantially improve the signal in the presence of noise or artifacts, without distorting or altering high quality data. In the example of FIG. 2A, scans from one subject exhibit considerable noise. The robust estimate improves the SNR by roughly 20%, with 50% rejection threshold, and the resulting signal is reduced slightly in the region of greater uncertainty. The data from the high-quality subject (FIG. 3B) is unaffected by the method.

Figure 4:
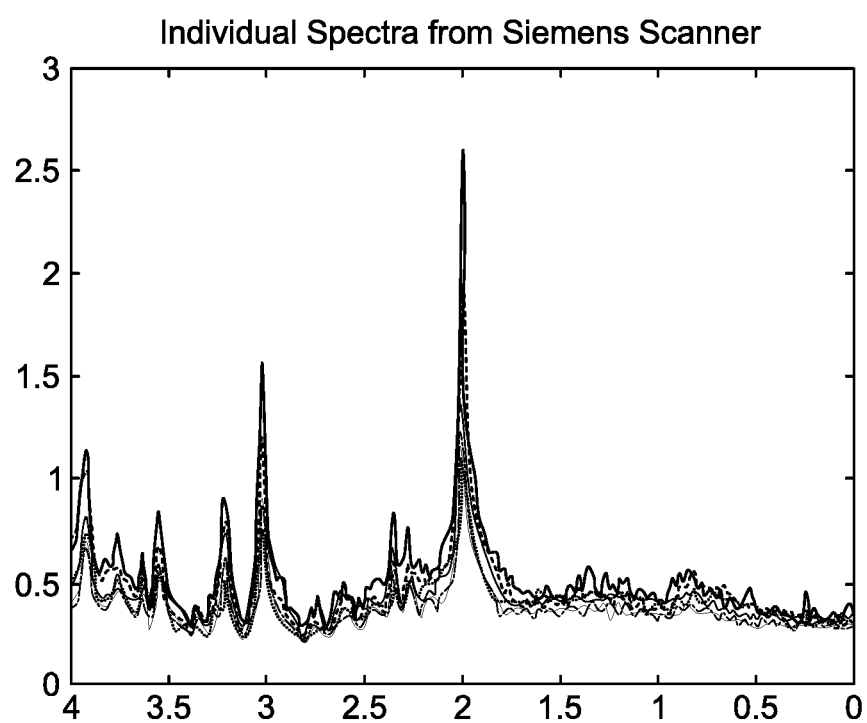
FIG. 4 shows individual MRS spectra, signal strength versus ppm, from the Siemens scanner. The spectra are the result of signal estimation.

FIG. 4 shows individual MRS spectra from the Siemens scanner. Each scan is the result of signal estimation process 100. In other words, each spectrum in FIG. 4 is "distilled" from a separate collection of a raw MRS data set. The peaks correspond to locations of H-atoms in various functional groups of molecules.

Figure 5A:
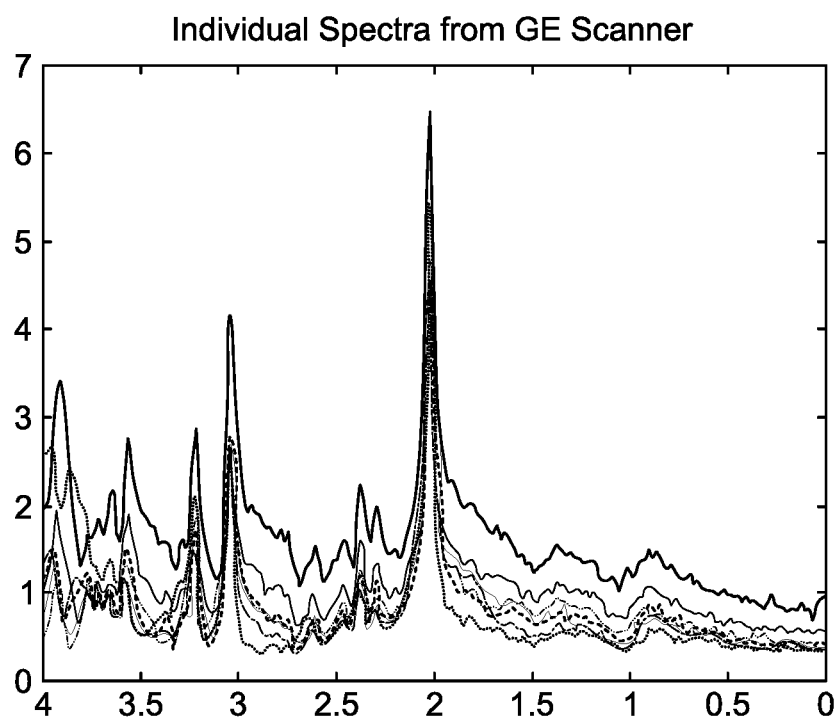
FIG. 5A shows individual MRS spectra, signal strength versus ppm, from the GE scanner. The spectra are the result of signal estimation.

FIG. 5A shows individual MRS spectra from the GE scanner. Each scan is the result of signal estimation process 100; i.e., each spectrum in FIG. 5A is "distilled" from a separate collection of raw MRS data. The peaks correspond to locations of H-atoms in various functional groups of molecules.

Comparing the Siemens and GE scans (FIGS. 4 and 5A), there is one obvious difference (in addition to other subtle ones). The gain of the GE scanner appears to be higher than that of Siemens. Just examining the highest peaks, it appears roughly to be 6.5/2.6=2.5 higher. But this judgment is approximate and can be misleading because of resolution and other settings of the scanners. This leads to the need for data harmonization.

Figure 5B:
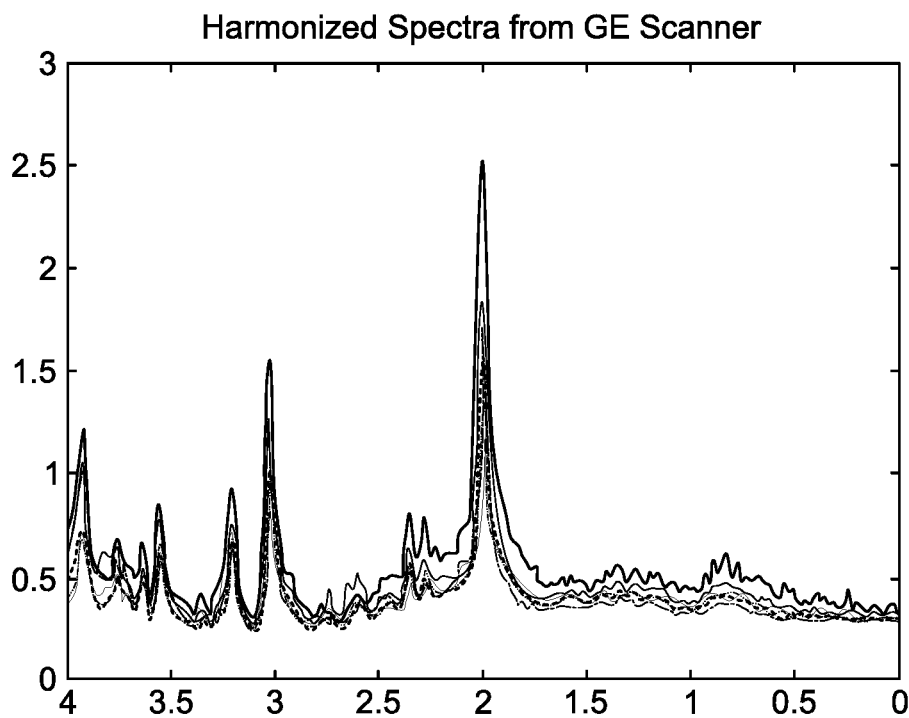
FIG. 5B shows the GE spectra of FIG. 5A after harmonizing them with respect to Siemens scans.

FIG. 5B shows the results of harmonizing the GE scans with respect to Siemens. The harmonization technique uses results of signal estimation method 100 to estimate the signals from multiple control subjects from each scanner. The harmonization then uses an empirical mapping using variances and means 211 and 212 of MRS scans as described earlier. The goal is to insure that signals acquired from different scanners are comparable. Thus, scans of the same control subjects would exhibit the same statistical properties.

Clearly, after harmonization the GE spectra are qualitatively similar to the Siemens spectra of FIG. 4. Here the unaltered Siemens spectra were used as reference spectra.

Figure 6A:
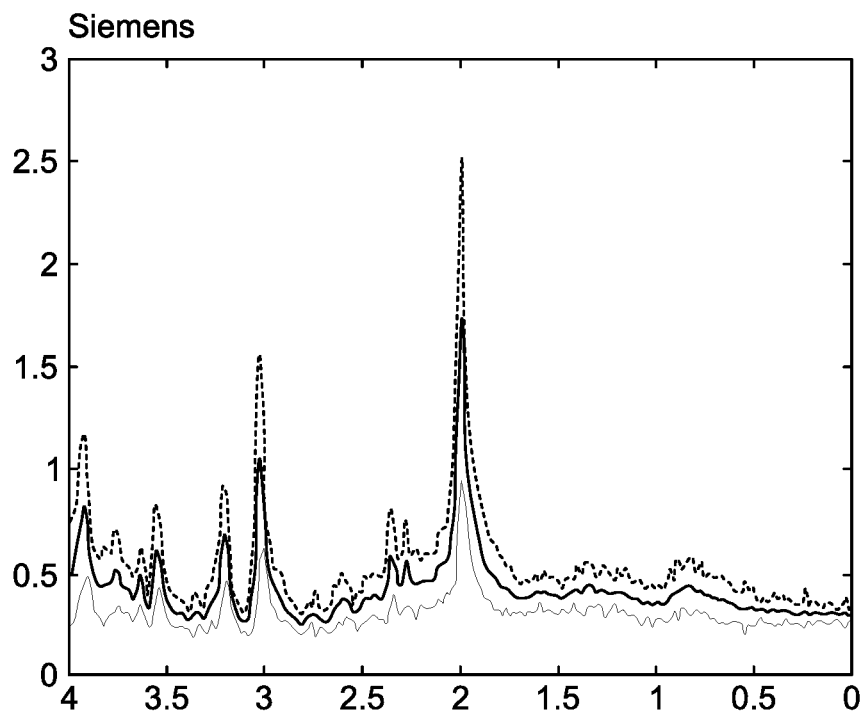
FIG. 6A shows MRS spectra from the Siemens scanner with 95% confidence bounds. The spectra are a subset of those shown in FIG. 4.

FIG. 6A shows the Siemens scans from FIG. 4, but the spectra which lie beyond the 95% confidence level, i.e., outside±1.96×standard deviation assuming Gaussian (normal) distribution of data, are omitted from the plot.

Figure 6B:
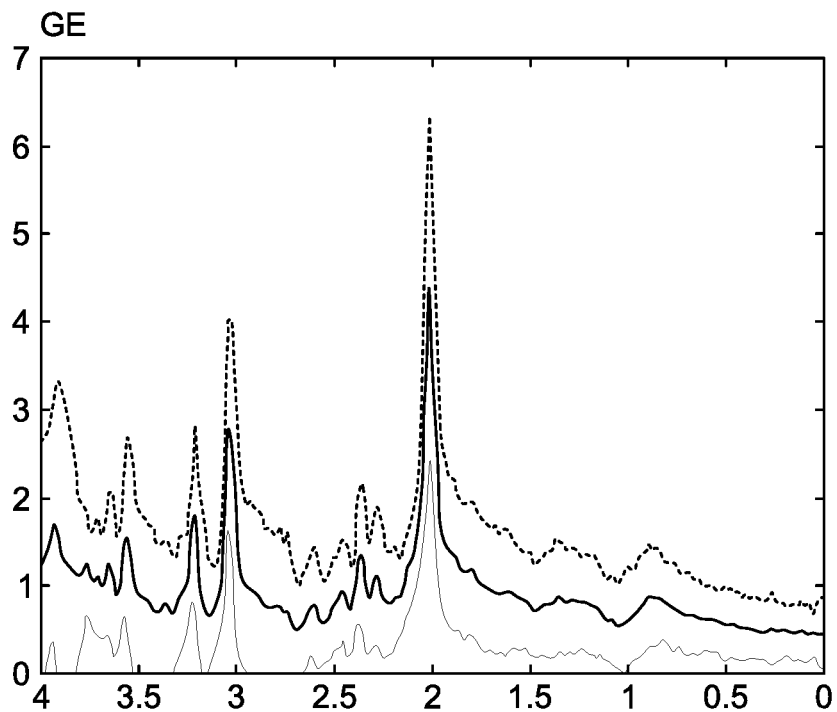
FIG. 6B shows spectra similar to 6A for the GE scanner. The spectra are a subset of those shown in FIG. 5A.

FIG. 6B shows the GE scans from FIG. 5A, but the spectra which lie beyond the 95% confidence level are omitted from the plot. Clearly the Siemens plots are closer and more similar to each other than GE plots. This is likely a reflection of the dynamic nature of the sample (control subject) and instrument settings than the scanners themselves.

While this invention has been particularly shown and described with references to preferred embodiments thereof, it will be understood by those skilled in the art that various changes in form and details may be made therein without departing from the scope of the invention encompassed by the appended claims.

What is claimed is:

1. A magnetic resonance spectroscopy (MRS) system, comprising:
   target and reference MRS scanners producing MRS data of subjects; and
   an analysis system that performs signal estimation to eliminate outlier spectra and a data harmonization process in which the spectra from control subjects from the target scanner are adjusted and normalized scans to ensure that the amplitudes and frequencies of the peaks correspond to scans from the reference scanner to facilitate comparison of the relative abundance of specific metabolites as measured by the target and reference scanners;
   wherein the data harmonization includes dividing signals from the target and reference MRS scanners for the control subjects by respective standard deviations to get two normalized signals for the target and reference scanners, then a ratio of normalized signals of the reference scanner to normalized signals of the target scanner are used to adjust the signals from the target scanner, then the adjusted signals of the target scanner are multiplied by the standard deviation of the signals of the target scanner.

2. A system as claimed in claim 1, wherein the control subjects are scanned in each of the scanners.

3. A system as claimed in claim 1, further comprising calculating a mean as a function of parts per million for each of the control subjects.

4. A system as claimed in claim 1, further comprising repeating the signal estimation until a threshold condition is met.

5. A system as claimed in claim 4, wherein the threshold condition is a minimum percentage of raw data that must be included to compute a mean.

6. A system as claimed in claim 4, wherein the threshold condition is a specified signal-to-noise (SNR) ratio.

7. A system as claimed in claim 1, wherein the multiple scanners are pair-wise harmonized with the reference scanner.

8. A method for harmonizing magnetic resonance spectroscopy (MRS) data, comprising:
   producing MRS data of control subjects with a target scanner and a reference scanner;
   performing signal estimation to eliminate outlier spectra and data harmonization in which the spectra from the control subjects from the target scanner and the reference scanner are adjusted and normalized to ensure that the amplitudes and frequencies of the peaks correspond to scans from a reference scanner to facilitate comparison of the relative abundance of specific metabolites as measured by the multiple scanners, wherein the data harmonization includes dividing signals from the target and reference MRS scanners for the control subjects by respective standard deviations to get two normalized signals for the target and reference scanners, then a ratio of normalized signals of the reference scanner to normalized signals of the target scanner are used to adjust the signals from the target scanner, then the adjusted signals of the target scanner are multiplied by the standard deviation of the signals of the target scanner.

9. A method as claimed in claim 8, further comprising using a resulting mapping to harmonize further MRS data.

10. A method as claimed in claim 8, wherein the control subjects are scanned in each of the scanners.

11. A method as claimed in claim 8, further comprising calculating a mean as a function of parts per million for each of the control subjects.

12. A method as claimed in claim 8, further comprising repeating the signal estimation until a threshold condition is met.

13. A method as claimed in claim 12, wherein the threshold condition is a minimum percentage of raw data that must be included to compute a mean.

14. A method as claimed in claim 12, wherein the threshold condition is a specified signal-to-noise (SNR) ratio.

15. A method as claimed in claim 8, wherein the multiple scanners are pair-wise harmonized with the reference scanner.

* * * * *